United States Patent
Trapp

(10) Patent No.: US 7,202,171 B2
(45) Date of Patent: Apr. 10, 2007

(54) METHOD FOR FORMING A CONTACT OPENING IN A SEMICONDUCTOR DEVICE

(75) Inventor: Shane J. Trapp, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/752,685

(22) Filed: Jan. 3, 2001

(65) Prior Publication Data

US 2002/0123226 A1 Sep. 5, 2002

(51) Int. Cl.
*H01L 21/311* (2006.01)

(52) U.S. Cl. .................. 438/694; 438/706; 438/672

(58) Field of Classification Search ............ 438/700, 438/694, 695, 696, 637, 639, 672, 675
See application file for complete search history.

(56) References Cited

U.S. PATENT DOCUMENTS

| 4,397,724 A | | 8/1983 | Moran |
| 4,734,157 A | | 3/1988 | Carbaugh et al. |
| 4,857,140 A | | 8/1989 | Lowenstein |
| 4,985,373 A | * | 1/1991 | Levinstein et al. ......... 438/620 |
| 5,286,344 A | * | 2/1994 | Blalock et al. ............. 156/657 |
| 5,423,945 A | | 6/1995 | Marks et al. |
| 5,458,734 A | | 10/1995 | Tsukamoto |
| 5,814,563 A | * | 9/1998 | Ding et al. .................. 438/714 |
| 5,935,877 A | | 8/1999 | Autryve |
| 5,965,035 A | | 10/1999 | Hung et al. |
| 5,989,987 A | | 11/1999 | Kuo |
| 6,015,760 A | | 1/2000 | Becker |
| 6,015,761 A | | 1/2000 | Merry |
| 6,103,137 A | * | 8/2000 | Park ........................... 216/46 |
| 6,140,168 A | * | 10/2000 | Tan et al. .................... 438/197 |
| 6,277,733 B1 | | 8/2001 | Smith |

FOREIGN PATENT DOCUMENTS

| EP | 0553961 A2 | | 1/1993 |
| JP | 54054578 | | 4/1979 |
| JP | 09260350 | * | 10/1997 |

OTHER PUBLICATIONS

Smolinsky et al, "Reactive Ion Etching of Silicon oxides with Ammonia and Trifluoromethane, the Role of Nitrogen in the Discharge", J. Electrochem. Soc.: Solid-State Science and Technology, vol. 129 No. 5, May 1982, pp. 1036-1039.*

* cited by examiner

*Primary Examiner*—Jack Chen
(74) *Attorney, Agent, or Firm*—Dickstein Shapiro LLP

(57) ABSTRACT

A method of forming a self-aligned contact opening in an insulative layer formed over a substrate in a semiconductor device involves etching the insulative layer with at least one fluorocarbon and ammonia.

17 Claims, 2 Drawing Sheets

METHOD FOR FORMING A CONTACT OPENING IN A SEMICONDUCTOR DEVICE

FIELD OF THE INVENTION

The present invention relates to a process for etching a self-aligned contact opening in a semiconductor device, and more particularly, to a method of plasma etching to prevent build up of undesirable polymers during contact formation. The invention also relates to a composition useful in the method of plasma etching described herein, as well as to the semiconductor structures formed thereby.

BACKGROUND OF THE INVENTION

In the formation of contact openings or vias in semniconductor devices used to provide metal-to-metal or conductive layer-to-conductive layer contacts, it is often necessary to etch through one or more layers of insulative material formed over a substrate. FIG. 1 shows a cross section of a portion of a semiconductor device 10 in an intermediate stage of fabrication. The integrated circuit wafer section 10 has a substrate 12. The substrate is formed of a semiconductor material, for example silicon, or a semniconductor material over an insulator, for example silicon-on-insulator (SOI). Field oxide regions 13, transistor gate stacks 15, side wall spacers 17 protecting the gate stacks, and doped regions 19 are formed over the substrate. A layer of insulating material 21, which is usually a type of glass oxide available in the art, for example, Boro-Phospho-Silicate Glass (BPSG), or silicon oxide material such as silicon dioxide or Tetraethylorthosilicate (TEOS) is formed over the substrate 12. The layer of insulating material 21 may, in actuality, be formed as one or more layers of insulating material of, for example, BPSG, TEOS or silicon dioxide. The insulating layer 21 may be anywhere from a few hundred Angstroms to several thousand Angstroms in thickness. Formed over the insulative layer is a photoresist masking layer 23 using available photoresist materials. The photoresist layer 23 has a patterned opening 25 corresponding to the outline represented by the dotted lines shown in FIG. 1. The patterned opening forms the outline of a self-aligned contact (SAC) opening which is thereafter created. The SAC opening will provide access to the substrate 12 through the insulative layer 21.

Referring to FIG. 2, a plasma etch is then conducted to form the SAC opening 27, using the patterned opening 25 of the photoresist masking layer 23 as a guide. The patterned opening 25 generally follows the outline of the sides of the spacers 17 to align the etch for the contact opening. During the etching process, one or one fluorocarbons are introduced into a chamber containing the semiconductor device 10. Under suitable conditions ionic and neutral etchants are then formed to etch the insulative layer 21 so as to form the opening 27. Unfortunately, under prevailing conditions the reaction of these etchants and other species with the insulative material of layer 21 produces a polymer layer 29 on the bottom and side wall spacers of opening 27 as a reaction product. A thin accumulation of polymer layer 29 along the sides of the side wall spacers 17 may be desirable to prevent subsequent erosion of the spacers. However, a build up of polymer layer 29 at the bottom of the SAC opening 27 can cause an undesirable phenomenon known as "etch stop", in which further etching through the insulative layer 21 to the surface of the substrate 12 is prevented by this polymer layer build up 29. In effect, the etch stop polymer layer 29 formed from the insulative layer can significantly inhibit suitable formation of the contact opening 27.

Attempts have been made to prevent etch stop during contact opening formation. For example, it is known to add oxygen ($O_2$) to the mixture of fluorocarbon gases which are introduced into the reaction chamber. As a result, the etch rate of insulative material, e.g. oxide, has been shown to increase. The addition of oxygen appears to be accompanied by an increase in the density of the fluorine atoms in the etchant discharge. However, the use of too much oxygen may undesirably dilute the fluorine concentration, and thereby decrease the etch rate. Oxygen may also be utilized to clean polymer debris from the bottom of the contact opening after exposure to the fluorine-based etchant plasma. Nitrogen ($N_2$) has also been utilized for cleaning residual debris after the etching process.

What is now needed in the art is a new method of forming a self-aligned contact opening in a semiconductor structure which can substantially eliminate etch stop problems. Also needed is a new composition which can be utilized in conjunction therewith.

SUMMARY OF THE INVENTION

In accordance with one aspect of the invention a method is provided for forming an opening in an insulative layer formed over a substrate in a semiconductor device in which the insulative layer is etched with ammonia and at least one fluorocarbon. The process parameters hereinafter described will substantially reduce or eliminate the formation of an "etch stop".

Also in another aspect the invention provides a composition suitable for use in etching an insulative layer formed over a substrate in a semiconductor device. The composition comprises a gaseous mixture of at least one fluorocarbon and ammonia.

In another aspect the invention provides a process of forming an opening in an insulative layer formed over a substrate in a semiconductor device. A patterned photoresist mask layer is first formed over the insulative layer. A self-aligned contact opening is then etched in the insulative layer through an opening in the patterned resist layer. The opening is etched through to the substrate using a combination of ammonia and at least one fluorocarbon.

In another aspect the invention provides a method of preventing etch stop during etching of a semiconductor device which comprises adding ammonia to at least one fluorocarbon which is utilized for the etching.

In another aspect the invention provides a method of preserving a side wall spacer surrounding a gate stack during a self-aligned contact etch. The side wall spacer is contacted with a combination of at least one fluorocarbon and ammonia so as to form a protective layer thereover. The protective layer prevents erosion of the spacer as the contact opening is formed through to the substrate upon which the gate stack has been formed.

In another aspect the invention provides a method of forming a conductive plug inside a contact opening in an insulative layer between adjacent gate stacks formed over a substrate in a semiconductor device. The insulative layer is contacted with a plasma etchant mixture containing ammonia and at least one fluorocarbon at a pedestal temperature within the range of about −50 to about 80 degrees Celsius so as to form a self-aligned contact opening in the insulative layer between the gate stacks without an etch stop. The contacting further forms a protective or passivating (nitrogen containing) layer over opposed side wall spacers which have been formed at the gate stacks. A conductive plug is then deposited inside the opening such that the plug is separated from the side wall spacers by the protective layer.

These and other advantages and features of the present invention will become more readily apparent from the following detailed description and drawings which illustrate various exemplary embodiments.

DETAILED DESCRIPTION OF THE PREFERRED EMBODIMENTS

Reference herein shall be made to the term "substrate," which is to be understood as including silicon, a silicon-on-insulator (SOI) or silicon-on-sapphire (SOS) structures, doped and undoped semiconductors, epitaxial layers of silicon supported by a base semiconductor foundation, and other semiconductor structures. In addition, when reference is made to a "substrate" in the following description, previous process steps may have been utilized to form arrays, regions or junctions in or over the base semiconductor structure or foundation. In addition, the semiconductor need not be silicon-based, but could be based on silicon-germanium, germanium, indium phosphide, or gallium arsenide. The term "substrate" as used herein may also refer to any type of generic base or foundation structure.

Figure 3:
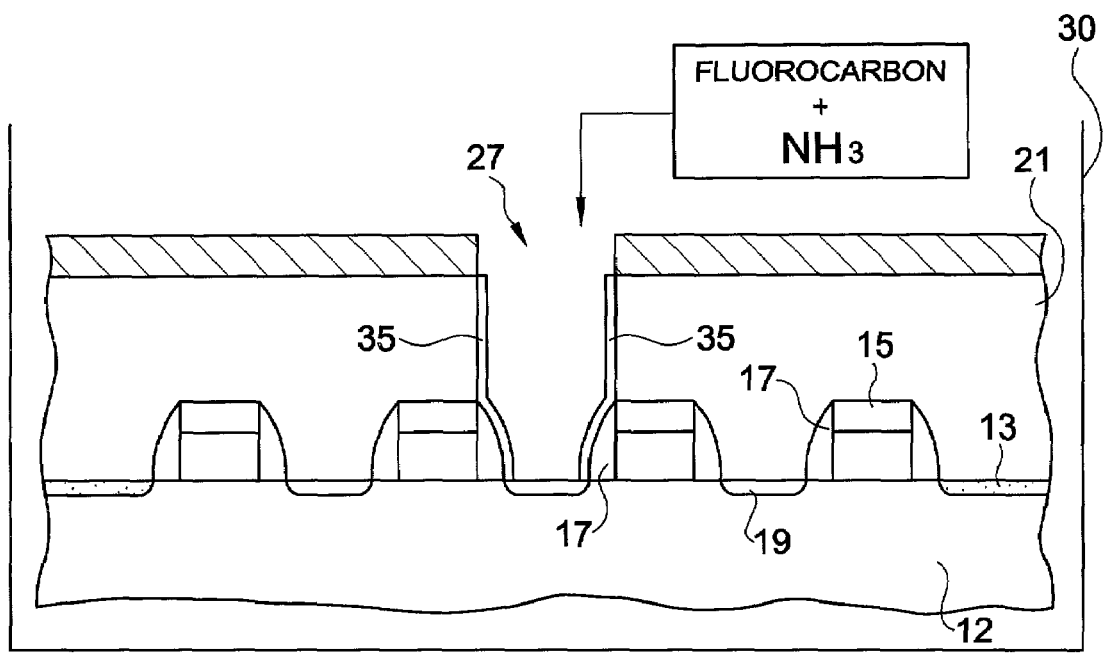
FIG. 3 is a cross sectional view of a semiconductor device which utilizes the method and composition of the invention.

Referring again to the drawings, FIG. 3 illustrates the method of the invention which mitigates etch stop problems. According to one embodiment, there is provided a method of forming a contact opening using at least one fluorocarbon. It is desirable that the contact opening be a self-aligned contact (SAC) opening, that is, an opening which is self-aligned between two successive gate stack structures. Preferably, at least two or more fluorocarbons are utilized, and in some embodiments at least three or more may be used as part of the invention. The fluorocarbon(s) may be chosen from those available in the art for plasma etching. Suitable fluorocarbons therefore include at least one member selected from the group consisting of fluorinated carbons, fluorohydrocarbons, chlorofluorocarbons and chlorofluorohydrocarbons. Non-limiting examples include such compounds as $C_4F_8$, $C_4F_6$, $C_5F_8$, $CF_4$, $C_2F_6$, $C_3F_8$, $CHF_3$, and $CH_2F_2$, and the like. Preferably, one or more of the compounds $CF_4$, $CHF_3$, and $CH_2F_2$ are utilized.

Figure 1:
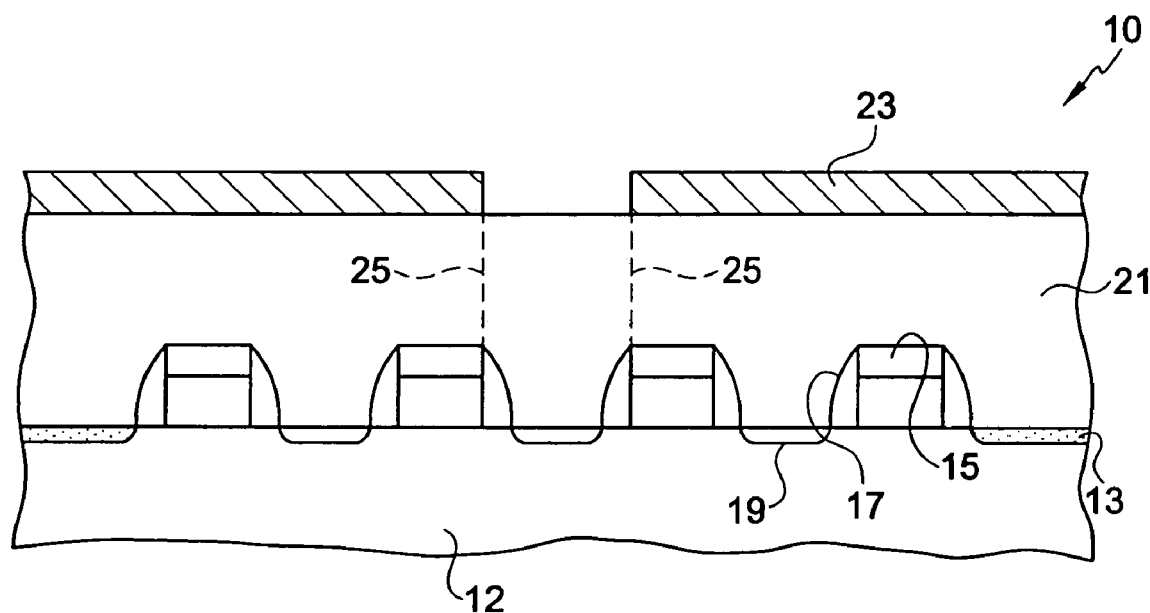
FIG. 1 is a cross sectional view of a semiconductor device in an intermediate stage of fabrication.
Figure 2:
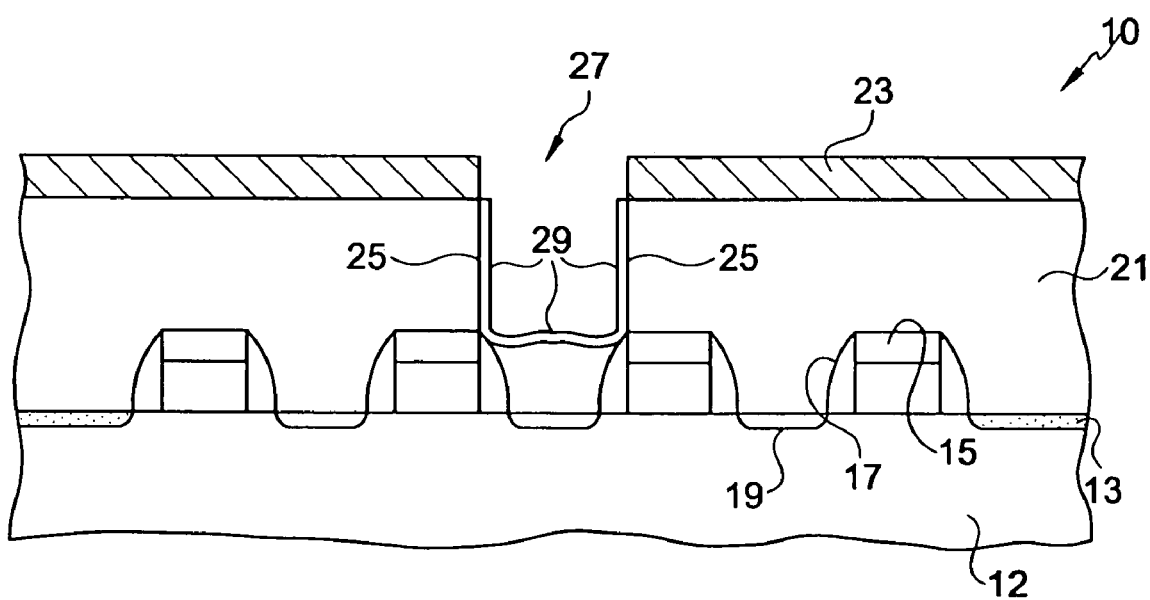
FIG. 2 is a cross sectional view of the device shown in FIG. 1 in a further stage of fabrication.

The fluorocarbon(s) are introduced with ammonia ($NH_3$) in a reaction chamber 30 together with the portion of the semiconductor device shown in FIG. 3. The chamber may be any suitable reaction vessel available for plasma etching. The ammonia may be obtained from any suitable source. It has now been shown that the combination of at least one fluorocarbon, together with ammonia, is not only effective in forming the contact opening 27 shown in FIG. 3, but is also effective in mitigating against etch stop, i.e. the problem illustrated in FIG. 2.

The fluorocarbon(s) and ammonia are introduced into a suitable reaction chamber along with the semiconductor device. The reaction chamber pedestal may be set at an operating temperature within the range of about −50 to about 80 degrees Celsius, with about 0 to about 80 degrees Celsius being preferred. Operating pressure is typically within the range of about 30 to about 60 milliTorrs, with about 40 to about 50 milliTorrs being more preferred, and about 45 milliTorrs being particularly desirable. About 600 watts of power is typically applied to the reaction chamber, but the wattage can vary within a range of about 500 to about 1500 watts.

The fluorocarbon(s) and ammonia are introduced into the reaction chamber at a flow rate which will both allow formation of the self-aligned contact (SAC) opening 27 and prevent or reduce etch stop problems. In some embodiments, elimination or reduction of the etch stop problem may be quantifiable by the reduction in time it takes to complete formation of the opening, for example. The flow rates may vary slightly, but a ratio of the flow rate for each fluorocarbon to the flow rate of ammonia should typically be within the range of about 2:1 to about 40:1 (with flow rate being measured as scc/minute or sccm). It is preferred that the flow rate ratio not be less than about 3:1. More preferably, the flow rate ratio should be within the range of about 3:1 to about 20:1, and even more preferably about 4:1 to about 10:1.

Actual flow rates for each of the individual fluorocarbon(s) utilized to form the SAC opening 27 will usually be within the range of about 10 to about 50 sccm, with about 10 to about 40 sccm being preferred. The flow rate will vary according to the particular fluorocarbon being utilized, and different fluorocarbons may have different flow rates. For example, when $CF_4$ is utilized, a flow rate of about 15 to about 20 sccm is preferred, with about 16 to about 18 sccm being more preferred. When $CHF_3$ is utilized, a flow rate of about 35 to about 45 sccm may be preferred, with about 37 to 42 sccm being even more preferred. When $CH_2F_2$ forms part of the etchant plasma, a flow rate of about 10 to about 15 sccm is preferred, with about 11 to about 14 sccm being more preferred. In some embodiments of the invention, it may be desirable to utilize at least two of the foregoing fluorocarbons, and preferably all three at the flow rates already set forth.

The flow rate for the ammonia will usually be at least about 2 sccm, and should normally not exceed about 6 sccm. An upper limit flow rate of about 5 sccm is generally preferred. A flow rate range for the ammonia of about 2 sccm to about 4 sccm is especially desirable. The flow rates of both ammonia and the fluorocarbon(s) may be adjusted so as to yield the flow rate ratios previously described. An ammonia flow rate above about 8 sccm is generally not preferred because at this rate the resultant reactant mixture can sometimes cause loss of selectivity to the gate stack and/or spacer, and may also result in the etched opening not being self-aligned to the gate stacks and/or the side wall spacers.

One or more of the fluorocarbons and the ammonia may be introduced into the reaction chamber substantially simultaneously, or successively. The order of introduction should be consistent with the invention's goals of eliminating etch stop, while providing a SAC opening 27 to the substrate 12 in the device 10.

Other etchant gases which may be introduced into the reaction chamber together with the foregoing ammonia and fluorocarbon(s) can include oxygen, nitrogen and other compounds which are generally available in plasma etching.

After the etching process is complete such that the self-aligned contact opening 27 is formed, then the photoresist mask layer may be removed using available methods.

As a result of the invention, the device shown in FIG. 3 has a self-aligned contact opening 27 that is formed without etch stop problems. Moreover, the reactant mixture of fluorocarbon(s) and ammonia produces a thin protective layer 35 along the sides of the contact opening 27 defined by the sides of the insulative layer and the side wall spacers 17. The protective layer 35 is a polymeric material formed as a result of the reaction between the reactant mixture and the insulative layer and the side wall spacers, respectively. Formation of this protective layer 35 helps to prevent erosion and destruction of the side wall spacers during the etching process and thereafter, and is therefore desirable. The protective layer 35 is typically on the order of just a few Angstroms in thickness, e.g. about 5–50 Angstroms.

In contrast to the side wall spacers, substantially no layer is formed at the bottom of the opening 27. Without being bound by any particular theory, it appears that any de minimis layer of residue that may be formed is rather quickly eliminated as a result of continuous contact with the reactant mixture of the invention. Perhaps this is due at least in part to the differing chemical components which make up the insulative layer, in contrast to the side wall spacers upon the protective layer 35 is formed.

Figure 4:
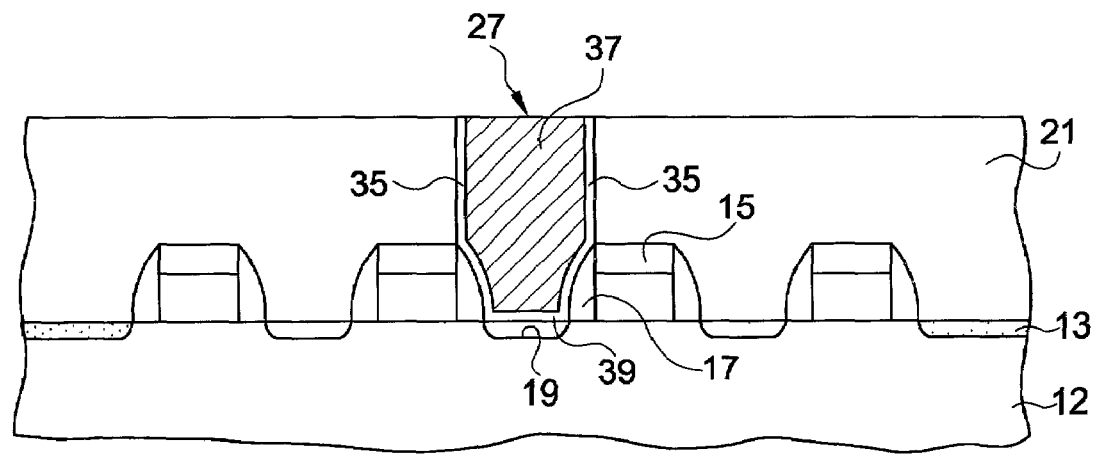
FIG. 4 is a cross sectional view of a semiconductor device according to a further embodiment of the invention.

A further embodiment of the invention is shown now with reference to FIG. 4. A conductive plug 37 may be formed in the contact opening 27 after completion of the etching process. The conductive plug may be formed using a conductive metal such as tungsten, for example, using tungsten hexafluoride ($WF_6$) and silane ($SiH_4$) using available deposition techniques. Formation of the conductive plug may be proceeded by titanium deposition and annealing to coat the inside of the contact opening 27 in which the plug is formed. Titanium deposition will form a thin contact layer 39, e.g. about 5–50 Angstroms, over the active region 19 of the substrate 12. This contact layer will in turn act as a protective barrier to prevent free fluorine and tungsten atoms from penetrating into the substrate 12 at the active region site 19 during formation of the conductive plug 37.

After deposition of the conductive plug 37, the top of the plug may be co-planarized with the top of the insulative layer 21 using chemical mechanical planarization (CMP) techniques, if desired. An optional conductive metal runner can also be provided over the plug 37 using available materials, e.g. aluminum, and methods (not shown in FIG. 4). As a result of the method and composition of the invention using the reactant mixture to etch the contact opening 27, the conductive plug 37 adheres more effectively inside the contact opening 27. In particular, the protective layer 35 prevents erosion of the side wall spacers 17 which could materially detract from the performance of the plug 37 and the gate stacks 15.

The following examples illustrate certain preferred embodiments of the invention, but should not be construed as limiting the scope thereof.

EXAMPLE 1

In this example, a self-aligned contact opening was formed in the device illustrated in FIG. 3. Plasma etching was conducted in a reaction chamber set at 600 watts, 45 milliTorr operating pressure, and 40 Gauss. Operating temperature was in the range of 0 to 50 degrees C. The following fluorocarbons were introduced into the reaction chamber together with ammonia, at the following flow rates:

| | |
|---|---|
| $CF_4$ | 18 sccm |
| $CHF_3$ | 40 sccm |
| $CH_2F_2$ | 13 scccm |
| $NH_3$ | 4 sccm |

Under the foregoing conditions, a self-aligned contact opening was formed in the device shown in FIG. 3 without etch stop.

EXAMPLE 2

In this example, the same operating parameters and reaction conditions were utilized as set forth in Example 1, except that the flow rate of ammonia ($NH_3$) was 2 sccm. Under these conditions, a suitable self-aligned contact opening was also formed without etch stop.

EXAMPLE 3 (COMPARATIVE EXAMPLE)

In this example, the same operating parameters and reaction conditions were utilized as set forth in Example 1, except that the flow rate of ammonia ($NH_3$) was 8 sccm. Under these conditions, loss of etch selectivity to gate stack and sidewall spacer was observed.

EXAMPLE 4 (COMPARATIVE EXAMPLE)

In this example, the same operating parameters and reaction conditions were utilized as set forth in Example 1, except that the flow rate of ammonia ($NH_3$) was 0 sccm. Under these conditions, etch stop was observed.

The foregoing description is illustrative of exemplary embodiments which achieve the objects, features and advantages of the present invention. It should be apparent that many changes, modifications, substitutions may be made to the described embodiments without departing from the spirit or scope of the invention. The invention is not to be considered as limited by the foregoing description or embodiments, but is only limited by the construed scope of the appended claims.

What is claimed is:

1. A process for forming an opening in an insulative layer formed over a substrate in a semiconductor device, said process comprising:

forming a pair of adjacent gate stacks over said substrate;

forming sidewall spacers on sidewalls of said adjacent gate stacks;

forming an insulative layer over said substrate;

forming a patterned photoresist mask layer over said insulative layer; and, etching an opening in said insulative layer defined at least in part by said sidewall spacers through an aperture in said patterned photoresist mask layer, wherein said opening is etched through to said substrate using a combination consisting essentially of ammonia and at least one fluorocarbon, wherein said at least one fluorocarbon is selected from the group consisting of $C_4F_8$, $C_4F_6$, $C_5F_8$, $CF_4$, $C_2F_6$, $CHF_3$, $CH_2F_2$ and $C_3F_8$, and wherein the flow rate ratio of said at least one fluorocarbon to said ammonia is from about 2:1 to about 40:1, and wherein the step of etching an opening in said insulative layer forms a protective layer on said sidewall spacers that is from about 5 to about 50 Å thick.

2. The method of claim 1, wherein said etching is performed to produce a self-aligned contact opening in said insulative layer, said opening is self-aligned between said adjacent gate stack structures with sidewall spacers.

3. The process of claim 1, wherein said etching is performed in a reaction chamber.

4. The process of claim 3, wherein said at least one fluorocarbon and said ammonia are flowed into said reaction chamber such the flow rate ratio of said at least one fluorocarbon to said ammonia is not less than about 3:1.

5. The process of claim 1, wherein said flow rate ratio is within the range of about 4:1 to about 10:1.

6. The process of claim 1, wherein said etching is performed without forming an etch stop.

7. The process of claim 6, wherein said opening is formed between said sidewall spacers on said pair of adjacent gate stacks.

8. The process of claim 7, wherein said etching is performed at a temperature within the range of about −50 to about 80 degrees Celsius.

9. The process of claim 8, wherein said etching is performed at a temperature within the range of about 0 to about 80 degrees Celsius.

10. The process of claim 9, wherein said method further comprises removing said photoresist mask layer after said etching.

11. A method of forming a conductive plug between adjacent gate stacks with sidewall spacers and inside a self-aligned contact opening formed in an insulative layer provided over a substrate in a semiconductor device, said method comprising:

contacting said insulative layer with a plasma etchant mixture consisting essentially of ammonia and at least one fluorocarbon at a temperature within the range of from about −50 to about 80 degrees Celsius so as to form a self-aligned contact opening defined at least in part by said sidewall spacers on adjacent gate stacks in said insulative layer without an etch stop, wherein said contacting further forms a protective layer over opposed sidewall spacers which have been formed over said adjacent gate stacks that is from about 5 to about 50 Å thick, wherein the flow rate ratio of said at least one flurocarbon to said ammonia is from about 2:1 to about 40:1, and said flow rate of said ammonia is at least about 2 sccm; and, depositing a conductive plug inside said etched opening such that said conductive plug is separated from said sidewall spacers by said protective layer.

12. The method of claim 11, wherein said contacting is performed by flowing said ammonia over said device in a reaction chamber at a flow rate within the range of about 2 sccm to about 6 sccm.

13. The method of claim 11, wherein said at least one fluorocarbon is at least one member selected from the group consisting of $C_4F_8$, $C_4F_6$, $C_5F_8$, $CF_4$, $CHF_3$, and $CH_2F_2$ and is flowed over said device at a flow rate within the range of about 10 sccm to about 45 sccm.

14. The method of claim 13, wherein said mixture comprises at least two fluorocarbons and said flow rate ratio of each said fluorocarbon to said ammonia is within the range of about 3:1 to about 20:1.

15. The method of claim 14, wherein said mixture comprises three fluorocarbons and said flow rate ratio is within the range of about 4:1 to about 10:1.

16. The method of claim 11, wherein said protective layer is a nitrogen containing layer.

17. The method of claim 11, wherein said temperature is a pedestal temperature and said range is from about 0 to about 50 degrees Celsius.

* * * * *

UNITED STATES PATENT AND TRADEMARK OFFICE
CERTIFICATE OF CORRECTION

PATENT NO. : 7,202,171 B2  
APPLICATION NO. : 09/752685  
DATED : April 10, 2007  
INVENTOR(S) : Shane J. Trapp It is certified that error appears in the above-identified patent and that said Letters Patent is hereby corrected as shown below:

In the Specification, the following errors are corrected:

Column 3, line 5, "wilt" should read --will--; and

Column 5, lines 23-24, "upon the" should read --upon which the--.

In Claim 4, the following error is corrected:

Column 7, line 9, "such the" should read --such that the--.

Signed and Sealed this

Third Day of July, 2007

JON W. DUDAS  
*Director of the United States Patent and Trademark Office*